(12) United States Patent
Fortmann

(10) Patent No.: US 8,501,332 B2
(45) Date of Patent: Aug. 6, 2013

(54) ENERGY CONVERSION CELL HAVING A DIELECTRICALLY GRADED REGION TO ALTER TRANSPORT, AND METHODS THEREOF

(75) Inventor: Charles M. Fortmann, Bellport, NY (US)

(73) Assignee: The Research Foundation of State University of New York, Albany, NY (US)

( * ) Notice: Subject to any disclaimer, the term of this patent is extended or adjusted under 35 U.S.C. 154(b) by 638 days.

(21) Appl. No.: 12/701,272

(22) Filed: Feb. 5, 2010

(65) Prior Publication Data

US 2010/0203364 A1    Aug. 12, 2010

Related U.S. Application Data

(60) Provisional application No. 61/150,182, filed on Feb. 5, 2009.

(51) Int. Cl.
| | | |
|---|---|---|
| H01M 14/00 | (2006.01) | |
| H01M 6/36 | (2006.01) | |
| H01M 2/26 | (2006.01) | |
| H01M 2/28 | (2006.01) | |
| H01M 8/00 | (2006.01) | |
| H02N 6/00 | (2006.01) | |
| H01L 31/00 | (2006.01) | |

(52) U.S. Cl.
USPC ............. 429/7; 429/11; 429/121; 429/400; 136/243; 136/252

(58) Field of Classification Search
USPC ............. 429/7, 400, 11, 121; 136/243, 252
See application file for complete search history.

(56) References Cited

U.S. PATENT DOCUMENTS

| | | | |
|---|---|---|---|
| 8,192,789 B2 * | 6/2012 | Albano et al. | 427/115 |
| 2005/0274411 A1 * | 12/2005 | King et al. | 136/256 |
| 2008/0142075 A1 | 6/2008 | Reddy | |

FOREIGN PATENT DOCUMENTS

| | | |
|---|---|---|
| DE | 19647534 | 5/1998 |
| EP | 1463073 | 9/2004 |
| EP | 1936644 | 6/2008 |
| JP | 2007123122 | 5/2007 |
| TW | 200847449 | 12/2008 |

OTHER PUBLICATIONS

B. Pradhan et al., *Organic photovoltaic devices: Concentration gradient of donor and acceptor materials in the molecular scale*, 155 Synthetic Metals 555-559 (Dec. 15, 2005).

* cited by examiner

*Primary Examiner* — Patrick Ryan
*Assistant Examiner* — Julian Anthony
(74) *Attorney, Agent, or Firm* — Scully, Scott, Murphy & Presser, P.C.

(57) ABSTRACT

Energy conversion devices and methods for altering transport of reaction species therein include use of a dielectrically graded structure (e.g., region, layer). For example, in photon energy conversion devices (e.g., solar cells) or in chemical energy conversion devices (e.g., fuel cells) one or more non-electric structures which provide a gradient in dielectric constant are positioned within the cell to alter the direction and/or rate of transport of a photo-generated or chemical reaction-generated species.

38 Claims, 12 Drawing Sheets ions, excitons, and radical charge or energy through a
energy conversion cells, such as, for example, a photon
energy conversion cell device (e.g., a photovoltaic cell) or a
chemical energy conversion cell (e.g., a fuel cell). The technical field of this application also relates to devices and methods for substantially inhibiting exciton transport in a photon energy conversion cell.

ENERGY CONVERSION CELL HAVING A DIELECTRICALLY GRADED REGION TO ALTER TRANSPORT, AND METHODS THEREOF

CROSS-REFERENCE TO RELATED APPLICATIONS

The present application claims the benefit of U.S. Patent Application No. 61/150,182, filed Feb. 5, 2009 and titled "Gradient Solar Cells," the entire contents of which are hereby incorporated herein by reference.

TECHNICAL FIELD

The technical field of this application relates to devices and methods for improving transport of one or more of electrons, holes, ions, excitons, and radical charge or energy through a energy conversion cells, such as, for example, a photon energy conversion cell device (e.g., a photovoltaic cell) or a chemical energy conversion cell (e.g., a fuel cell). The technical field of this application also relates to devices and methods for substantially inhibiting exciton transport in a photon energy conversion cell.

BACKGROUND

In general, energy conversion cell devices require several steps to convert energy such as light or a chemical reaction into electrical power. For example, in a solar cell, a first step includes an electronic mechanism whereby a photon excites an electron to a higher, more energetic energy level leaving behind a now vacant energy level or state. Both the photo-excited electrons and the vacant energy state (known as holes) must migrate to separate collection sites (e.g., anode and cathode). In solar cell devices, the separate collection sites for the electrons and holes become the negative and positive contacts. In some cases, the electron and hole travel together as an exciton prior to separation and collection.

The quest for cost effective solar electric generation has fueled research to find inexpensive materials that convert visible light photons into excited charges that can transport the absorbed energy to electrical contacts. Thus far many of the potential inexpensive alternatives to expensive high quality silicon have extremely poor transport. This poor transport inhibits the application of these less-expensive materials in photon energy conversion cells.

In high quality single-crystal silicon solar cells, electrons and holes have large diffusion coefficients and long lifetimes (i.e., the time it takes the photon-excited carrier to recombine with a hole, recombination typically results in heat generation and a failure to contribute collected charge). Single crystal silicon has electron mobility in excess of 100 cm$^2$/V-s. The lifetime of photo-generated minority carriers is sufficient to lead to a diffusion length of less than about 0.5 microns and over 100 microns for amorphous and single crystal silicon, respectively. These diffusion lengths roughly reflect the distance a photo-generated carrier can travel to charge a contact region of a solar cell.

Since amorphous silicon photovoltaic (e.g., solar) cells are typically more than 0.2 microns thick, many photo-generated carries (e.g., electrons, holes, ions, excitons, and radical charge or energy) would recombine prior to collection. The recombination problem can be decreased. However, by using an electric field to assist in carrier collection results in a loss in the available photo-generated power (due to reduced open circuit voltage).

In general, electric field aided collection requires either a graded electrical character (i.e., dopant concentration gradient) and/or a strongly insulating solar cell absorber layer. In the case of amorphous silicon solar cells, a insulating absorber material is used in combination with an assisting electric field. In single crystal silicon solar cells, a dopant gradient is often used near the electrodes to aid carrier collection and reduce recombination.

Recently, the prospect of utilizing low cost solid (e.g., plastic or polymer) and/or liquid junction solar cells has emerged as an important alternative energy prospect. Of particular interest is a dye-sensitized solar cell (a type of liquid junction solar cell) due to its incorporation of ultra low cost materials. Unfortunately, both the solid junction solar cells and the liquid junction solar cells suffer from poor transport of photo-generated charge. For example, the following materials used in solid type solar cells have the following mobility values: oligothiophene based materials have mobilities less than 0.03 cm$^2$/V-s, phthalocyines have mobilities less than 0.01 cm$^2$/V-s, pentacene has a mobility less than 0.62 cm$^2$/V-s, C$^{60}$ has a mobility value less than 0.08 cm$^2$/V-s, and perylene-diimide has a mobility less of about $1.5 \times 10^{-5}$ cm$^2$/V-s. In general, ionic charges diffuse in aqueous solutions with diffusion constants in the $10^{-5}$ cm$^2$/s range consistent with a mobility in the $10^{-4}$ cm$^2$/V-s range. As a result of these low mobilities, these materials transport photo-generated charge carries poorly, such that a significant portion of available voltage must be used to aid collection thereby reducing the voltage available for external power generation.

SUMMARY OF THE TECHNOLOGY

In general, the technology described in this application relates to altering or tailoring transport of species within energy conversion cells (such as, for example, photon energy conversions cells or chemical energy conversion cells). In one embodiment, the technology relates to improving (e.g., increasing) transport of one or more of electrons, holes, ions, excitons and radical-based charge or energy in an energy conversion cell, such as a photovoltaic cell or a fuel cell, by providing the energy conversion device with a dielectric region tailored (e.g., graded) to aid transport from an energy exchange region, such as a photon absorber in a photovoltaic cell, to a collection region (e.g., anode or cathode). In another embodiment, the technology relates to inhibiting transport of an exciton in a photon energy conversion cell by including a dielectric region tailored (e.g., graded) to substantially inhibit exciton transport from an energy exchange region (such as a photon absorption region) to a collection region.

The technology of this application also relates to non-electric field structures (e.g., insulating structures) that enhance (or in some applications, decrease) speed and help control direction of charged and uncharged photo-generated or chemical-generated energy carriers' motion. Photo-generated and chemical-generated energy carriers include charged species such as electrons, holes, ions, as well as uncharged species including excitons and radical-based energy or charge (e.g., exciting atoms and molecules). The non-electric field structures, such as dielectrically graded regions, can be used to improve solar cell performance and can also be applied to improve the speed or rate (catalyze) chemical reactions in fuel cells. In addition, in some embodiments, the non-electric field structures can be used to substantially inhibit movement (i.e., transport) of unwanted photo-generated species, such as excitons. In general, the non-electric field structures are comprised of at least one gradient, changed, or varied element (e.g., a single step function change or a gradual multi-step or wave change are including herein) involving the dielectric constant interacting with one or more transporting species. While not wishing to be bound by theory, it is believed that the graded dielectric structure alters (e.g., promotes or inhibits based upon location and direction of polarity) one or more of electron, hole, ion, exciton and radical-based charge or energy transport.

In general, in one aspect, the technology relates to an energy conversion device in which transport is improved. The energy conversion device includes a cathode; a first transport region; an energy exchange region; a dielectric region; a second transport region; and an anode; wherein the dielectric region is tailored to provide a dielectric constant of a graded value along a direction of transport to one of the anode or cathode to improve transport of one or more of electrons, holes, ions, excitons and radical-based charge or energy. In some embodiments, the energy conversion device is a photon-energy conversion device, such that the energy exchange region is a photon absorption region in which photons are accepted by a material which in response creates photo-generated species, such as electrons, holes, excitons, ions, or radical-based energy or charge. In other embodiments, the energy conversion device is a chemical-energy conversion device, such as a fuel cell, in which a chemical reaction occurs in the energy exchange region which creates the species to be transported (e.g., electrons, holes, excitons, ions, or radical-based energy or charge).

Embodiments of this aspect of the technology include one or more of the following features. In some embodiments, the energy exchange region is disposed within at least a portion of the first transport region. The dielectric region can be located at an interface between the energy exchange region and the second transport region. In some embodiments, the dielectric region includes structure shaped to provide the dielectric constant of graded value along the direction of transport. That is, in some embodiments the dielectric region is formed of a dielectric material deposited a structure, such as, for example a plurality of bumps or ridges. The shape of the structure creates the gradient in dielectric constant within the dielectric region. In some embodiments, the dielectric region comprises a plurality of particles of one or more dielectric materials disposed within a matrix material, such as, for example, water. To create further tailoring of the dielectric gradient, the concentration of the plurality of particles, in some embodiments, is varied monotonically through the dielectric region. In some embodiments, the dielectric gradient is tailored by varying the size of the plurality of particles disposed within the matrix. In some embodiments, the dielectric region is a layer of dielectric material in which the composition of the dielectric material is altered to produce the gradient in dielectric constant. The energy conversion cells in accordance with this aspect can be photon energy conversion cells, such as photovoltaic cells, especially solid or liquid junction solar cells. Some of the embodiments of the photovoltaic cells further include a spectral modification region for increasing photon absorption. The spectral modification region includes a composite film having a first refractive index and a matrix material having a second refractive index different from the first refractive index. The composite film of the spectral modification region is disposed on the matrix and includes luminescent materials and micron-sized silicon particles. In other embodiments, the energy conversion cell in accordance with the technology is a chemical energy conversion cell, such as a fuel cell. In this embodiment, one or more reaction species, such as, for example, electrons, ions, excitons and radical-based charge or energy is transported through the first transport region towards the cathode, wherein the reaction species acts as a catalyst in a reaction within the cathode. In some embodiments, the dielectric region is tailored to apply the dielectric gradient over a small length scale to affect the transport of a single reaction species. For example, in some embodiments, the dielectric region has a length scale in the direction of transport of about 100 angstroms or less (e.g., 50 angstroms, 40 angstroms, 30 angstroms, 20 angstroms). In some embodiments, the dielectric region has a length scale in the direction of transport of about 10 nanometers or more (e.g., 20 nm, 40 nm, 50 nm, 100 nm, 200 nm) to affect the transport of larger reaction species or clusters of reaction species over a longer length scale. Some embodiments feature the inclusion of two or more dielectric regions, in which a first dielectric region has a length scale of about 100 angstroms or less and a second dielectric region has a length scale of 10 nm or more. Some embodiments feature a device to apply an electric field across at least one of the first transport region and the second transport region.

In another aspect, the technology relates to an energy conversion device in which transport is improved. The energy conversion device includes a cathode; a first transport region; an energy exchange region comprising a matrix material having a first dielectric constant and a material having a second dielectric constant which is less than the first dielectric constant, the second material being dispersed within the matrix material to form a dielectrically graded composite region; a second transport region; and an anode.

Embodiments of this aspect of the technology include one or more of the following features. In some embodiments, the energy exchange region is disposed within at least a portion of the first transport region. The energy exchange region can include a plurality of particles or voids as the second material dispersed within the matrix material. To create further tailoring of the dielectric gradient within the energy exchange region, the concentration of the plurality of particles or voids, in some embodiments, is varied monotonically therethrough. In some embodiments, the dielectric gradient is tailored by varying the size of the plurality of particles or voids therethrough. The matrix material can be selected from plastic semiconductors, polymer semiconductors or inorganic semiconductors. The energy conversion cells in accordance with this aspect can be photon energy conversion cells, such as photovoltaic cells, especially solid or liquid junction solar cells. Some of the embodiments of the photovoltaic cells further include a spectral modification region for increasing photon absorption. The spectral modification region includes a composite film having a first refractive index and a matrix material having a second refractive index different from the first refractive index. The composite film of the spectral modification region is disposed on the matrix and includes luminescent materials and micron-sized silicon particles. In other embodiments, the energy conversion cell in accordance with the technology is a chemical energy conversion cell, such as a fuel cell. In this embodiment, one or more reaction species, such as, for example, electrons, ions, excitons and radical-based charge or energy is transported through the first transport region towards the cathode, wherein the reaction species acts as a catalyst in a reaction within the cathode. In some embodiments, the dielectric region is tailored to apply the dielectric gradient over a small length scale to affect the transport of a single reaction species. For example, in some embodiments, the dielectric region has a length scale in the direction of transport of about 100 angstroms or less (e.g., 50 angstroms, 40 angstroms, 30 angstroms, 20 angstroms). In some embodiments, the dielectric region has a length scale in the direction of transport of about 10 nanometers or more (e.g., 20 nm, 40 nm, 50 nm, 100 nm, 200 nm) to affect the transport of larger reaction species or clusters of reaction species over a longer length scale. Some embodiments feature the inclusion of two or more dielectric regions, in which a first dielectric region has a length scale of about 100 angstroms or less and a second dielectric region has a length scale of 10 nm or more. Some embodiments feature a device to apply an electric field across at least one of the first transport region and the second transport region.

In a further aspect, the technology relates to a photon-energy conversion device in which exciton transport is substantially inhibited. In some applications, the transport of excitons from a region of their creation, is unwanted (i.e., excitons, due to their large size and reactive state may negatively impact certain materials). In these applications, the photon-energy conversion device includes a cathode; a first transport region; a photon absorption region; a dielectric region; a second transport region; and an anode; wherein the dielectric region is tailored to provide a dielectric constant of a graded value along a direction of transport to one of the anode or cathode to inhibit exciton transport. In another embodiment, the photon-energy conversion device includes a cathode; a first transport region; a photon absorption region comprising a matrix material having a first dielectric constant and a material having a second dielectric constant which is less than the first dielectric constant, the second material being dispersed within the matrix material to form a dielectrically graded composite region; a second transport region; and an anode.

In another aspect, the technology is directed to a method of improving transport in an energy conversion cell (e.g., an energy conversion device). The method includes providing at least one dielectrically graded region between an anode and a cathode of the energy conversion device, wherein the at least one dielectrically graded region has a length scale of about 10 nanometers or more along a direction of desired charged species transport.

Embodiments of this aspect of the technology include one or more of the following features. In some embodiments, the method further includes applying an electric field to the energy conversion device. The dielectric region provided by the method can include a plurality of particles that is varied in concentration or size through the dielectrically graded region along the direction of desired charged species transport. In some embodiments, the dielectric region is deposited to form structures which provide the length scale of about 10 nanometers or more along the direction of desired charged species transport. Some embodiments feature an additional step of providing a second dielectrically graded region.

In a further aspect, the technology relates to a method of altering exciton transport in an energy conversion device. The method includes providing at least one dielectrically graded region between an anode and a cathode of the energy conversion device, wherein the at least one dielectrically graded region has a length scale of about 100 angstroms or less along a direction of desired exciton transport.

Embodiments of this aspect of the technology include one or more of the following features. In some embodiments, the dielectrically graded region applied by the method includes a plurality of particles varied in concentration or size through the dielectrically graded region along the direction of desired exciton transport. In some embodiments, the dielectrically graded region is deposited to form structures which provide the length scale of 100 angstroms or less along the direction of desired exciton transport. The dielectrically graded region can be graded to improve exciton transport. In other methods, the dielectrically graded region can be graded to substantially inhibit exciton transport. Embodiments can also feature a step of providing a second dielectrically graded region to the energy conversion cell device.

The conversion cells, conversion devices, and methods in accordance with the technology of this application provide many advantages. One advantage is that the non-electric field structures (e.g., dielectrically graded regions) alter species transport (rate and direction) which can be used to generate a desired performance of the energy conversion cell or device (e.g., improve rate of species transport, inhibit species transport). Another advantage of the technology is improved photovoltaic performance of solid or liquid junction solar cells, especially low cost dye-sensitized solar cells.

The above embodiments, advantages, and features will be more fully understood by reference to the following description and drawings.

BRIEF DESCRIPTION OF THE DRAWING

In the drawings, like reference characters generally refer to the same parts throughout the different views. Also the drawings are not necessarily to scale, emphasis instead being placed upon illustrating the principles of the disclosure.

DESCRIPTION

In general, the effectiveness of energy conversion cell devices are limited by transport of energy exchange generated (i.e., reaction generated, such as, photo-generated or chemical reaction-generated) species to a region of collection and possible reaction (e.g., anode, cathode). Until now, a diffusive process and/or an electric field driven process have been utilized to move the energy exchange generated species (i.e., reaction generated species) to the anode or cathode for power generation. The technology of the present application is directed to the use of a non-electric field, non-diffusive processes for reaction generated species (e.g., electrons, holes, ions, excitons, and radical-based charge or energy) motion.

The technology described herein can be applied to not only improve efficiency and transport of photovoltaic cells and fuel cells, but also to allow for the incorporation of lower cost or less expensive materials to be utilized in the conversion cells. For example, the increased mobility transport provided by an embodiment of the technology allows for the effective use of low cost photon absorption materials, such as liquid dyes to be used in place of expensive single crystal silicon or other single crystal semiconductors in photovoltaic cells.

Figure 1:
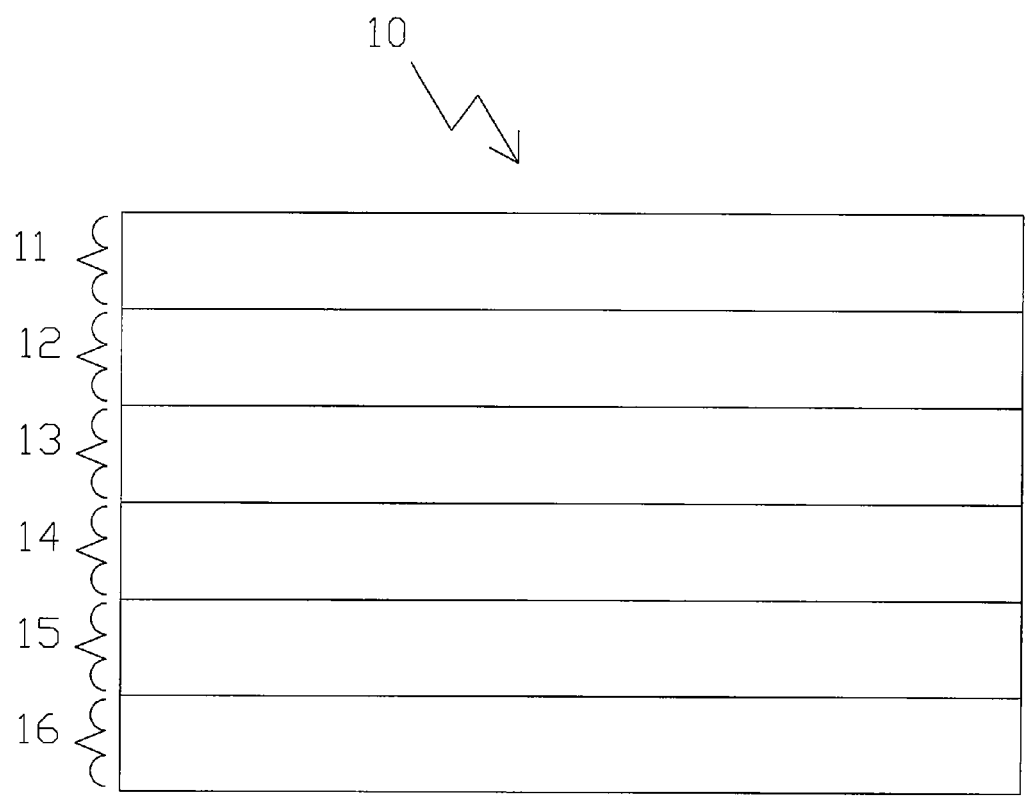
FIG. 1 is an illustration of a cross-sectional view of an embodiment of an energy conversion cell in accordance with an embodiment of the technology.

Referring to the drawings, FIG. 1 illustrates an embodiment of an energy conversion cell 10 in accordance with the present technology. The energy conversion cell 10 includes a cathode 11, a first transport region 12, an energy exchange region 13, a dielectric region 14, a second transport region 15 and an anode 16. The energy conversion cell 10 operates by a reaction initiated in the energy exchange region 13. In a photon energy conversion cell, for example, a photon is absorbed by a material within the energy exchange region 13. The absorbed photon supplies enough energy to the material within the energy exchange region 13 that an electron within a lower-energy valence band is pushed into a higher energy state. The electron and hole generated by this reaction then are separately transported through one of the first transport region 12 and the second transport region 15 towards a cathode 11 or anode 16.

The cathode 11 and anode 16 of the cell 10 can be sandwiched between a protective cover, such as, for example, glass plates, transparent polymer sheets, or a metal casing. The cathode 11 and anode 16 are regions of collection for reaction generated species. That is, the cathode 11 is a region tailored to attract and accept negatively charged species or a particular type of radical-based energy; whereas the anode 16 is a region tailored to attract and accept positively charged species or other radical-based energy. The reaction generated species (e.g., electrons, holes, excitons, ions, radical-based charge or energy) move towards their respective anode 16 or cathode 11 and once delivered can either (a) collect within the respective anode or cathode for use in an electrical circuit or (b) act as catalysts for reactions within the respective anode or cathode for the generation of power.

The dielectric region 14 is positioned within the cell 10 to aid the transport of the reaction generated species from the energy exchange region 13 towards its respective anode 11 or cathode 16. In this embodiment, the dielectric region 14 is positioned at the interface between the energy exchange region 13 and the second transport region 15. The dielectric region 14 includes a material tailored to provide a dielectric constant of a graded value along a direction of transport to one of the anode or cathode. In some embodiments, the material of the dielectric region is graded to improve transport of one or more of electrons, holes, ions, excitons and radical-based charge or energy. Grading may occur through the use of a single step function to provide a distinct step or change in the value of the dielectric constant or, in some embodiments, grading may occur gradually through the use of multiple steps or a wave or other continuous function to provide a gradual or continuous change in the value of the dielectric constant throughout the dielectric region 14 along a direction of reaction generated species motion. For example, to improve or increase the rate of motion of electrons through the first transport region 12 towards the cathode 11, the dielectric constant is graded to provide an increase in value through the dielectric region 14 in a direction towards the cathode 11.

As discussed above, the transport of reaction species in certain solar cells is poor or too inefficient to be widely commercialized. Specifically, the mobility in conductive plastics is typically of the order of $10^{-5}$ cm$^2$/v-s and the diffusivity in a liquid is typically of the order of $10^{-5}$ cm$^2$/s implying mobility (via the Einstein relation $$\left(\text{via the Einstein relation mobility} = \frac{D}{kT}\right)$$

in the range of ~4×10$^{-4}$ cm$^2$/V-s. These values are relatively poor when compared to the mobility of crystal silicon (>100 cm$^2$/V-s) and amorphous silicon ~1 cm$^2$/V-s. To estimate the impact of these values consider the voltage, V, needed to provide an electric current, $J_{sc}$, of ~17 mA/cm$^{-2}$ (the current of reasonably good amorphous silicon solar cell with ~10% conversion efficiency). Since $J_{sc}$ is:

$$J_{sc} \cong \mu N \frac{V}{d}. \qquad \text{Eq. (1)}$$

where N is the density of photo-generated species (assumed to be 10$^{18}$ cm$^{-2}$ for this illustration), the thickness of the region over which the charge must be transported is, d, taken here to be 0.5 μm. It follows that to achieve the required current when the mobility is taken to be 5×10$^{-5}$ cm$^{-2}$/V-s is 0.1 V. Therefore since the voltage of a typical dye-based and/or organic material-based solar cell is only ~0.5V and since the energy needed to provide transport cannot also contribute to the observed external power approximately 20% of the power is lost on transport.

To improve the rate of transport, the technology of the present application focuses on the application of a dielectric gradient. Without wishing to be bound by theory, it is believed that the application of a dielectric gradient within an energy conversion cell effects the transport of reaction generated species. Specifically, it is believed that the dielectric gradient effects both the direction and the speed of transport of the reaction generated species.

The degree of polarization is described by a material property known as permittivity, $\in$, and the permittivity of free space is $\in_0$. These quantities are fundamental to electrostatic force and energy. Since the force vector, $\vec{F}$, and the energy, E are given by:

$$\vec{F} = \frac{q_1 \times q_2}{4\pi \varepsilon r^2} r' \text{ and } E = \frac{q_1 \times q_2}{4\pi \varepsilon r} \qquad \text{Eq. (2)}$$

where $q_1$ and $q_2$ are two interacting charges, r the distance separating the two charges, and r' is the unit vector describing the direction between the two charges.

In the case where a single charge (e.g., an electronic charge or an ion) is present, there is a significant amount of energy related to the polarization of the surrounding media. In all cases a given region of space having an electric field (e.g., from a nearby charge) can reduce its energy when filled with a polarizing media. Since, it is known that ions and charges interact with the surroundings media via polarization and since the polarization reduces the ionic electric field energy, W, via:

$$W = -\frac{1}{2}\int_{V_1} (\varepsilon_1 - \varepsilon_0)\vec{E}\cdot\vec{E}_0 dx^3. \qquad \text{Eq. (3)}$$

where, $\varepsilon_0$ is the dielectric of free space, $\varepsilon_1$ is that of a media under consideration. The electric field for a point charge or ion external to the region under consideration is given by $$\vec{E} = \frac{e}{\varepsilon_1 r^2}\hat{r} \text{ and } \vec{E}_0 = \frac{e}{\varepsilon_0 r^2}\hat{r}$$

for the cases where the region is filled with polar media and with free space respectively. Therefore, a gradient in the dielectric constant results in an energy gradient (or force) defined by the derivative of Eq. 3 with respect to the displacement, X:

$$\text{Force} = \frac{\delta W}{\delta x} = \frac{\delta\left(-\frac{1}{2}\int_{V_1}(\varepsilon_1-\varepsilon_0)\vec{E}\cdot\vec{E}_0 dx^3\right)}{\delta\varepsilon_1}\frac{\delta\varepsilon_1}{\delta x} \qquad \text{Eq. (4)}$$

In the case where $\varepsilon_0 \gg \varepsilon_1$ and the only electric field is the point charge and/or ionic field radiating outward from the ion under consideration Eq. 4 can be written:

$$\text{Force} = \frac{\delta W}{\delta x} = \frac{\delta\left(\frac{1}{2}\int_{V_1}\frac{e^2}{\varepsilon_1 r^4}dx^3\right)}{\delta\varepsilon_1}\frac{\delta\varepsilon_1}{\delta x} = \qquad \text{Eq. (5)}$$

$$\frac{\left(\frac{-1}{2}\int_{V_1}\frac{e^2}{\varepsilon_1^2 r^4}dx^3\right)}{1}\frac{\delta\varepsilon_1}{\delta x} = \frac{2\pi(r^{-3}-a^{-3})}{3\varepsilon_1^2}\frac{\delta\varepsilon_1}{\delta x}$$

where a is the minimum radius (that of the ion) and r can be taken to be distance half way to the next ion. From Eq. 5 it is seen that a force results from a gradient in the dielectric constant, $$\frac{\delta\varepsilon_1}{\delta x}.$$

As a result, a gradient in dielectric constant (e.g., by variation the media) provides a motive force to charges and ions that can be used to assist transport in solar cells and other devices and processes.

Like charged entities, neutral entities may also obtain motive force from a dielectric constant gradient. Of particular note is the recognition that the exciton, a bound electron and hole, although neutral obtains motive force from dielectric gradients. Starting with the accepted form of the exciton energy:

$$E_{ex,n} = \frac{(M_r/m)E_H}{\varepsilon^2 n^2} \xrightarrow{m_e^*=m_h^*=m_e} \frac{6.7}{\varepsilon^2 n^2}\text{eV} \qquad \text{Eq. (6)}$$

where $M_r$ is the reduced mass of the electron-hole pair, m is the rest mass of the electron, $E_H \sim 13.6$ eV is the hydrogen atom energy, n, is the energy level index n=1, 2, 3 . . . ). Examining the energy change induced by a dielectric gradient results in:

$$\frac{\partial E_{ex,n}}{\partial x} = \left(\frac{-13.4}{\varepsilon^3 n^2}\right)\left(\frac{\partial \varepsilon}{\partial x}\right)(\text{eV/cm}) \qquad \text{Eq. (7)}$$

The above shows that transport within a dye molecule (or other molecular system and or between a molecule and/or an interface to a solid and/or second molecular system and/or liquid and/or gas) can be markedly affected by local dielectric gradient. The direction of travel in accordance with Eq. 7 will be towards reducing energy and therefore in the direction of increasing dielectric constant. This dielectric force is related to the inverse cube of the dielectric constant and proportional to the gradient of the dielectric constant. Thus this force will be greatest for step gradients having a small dielectric constant starting point.

Also of importance is the radius of the exciton orbit. As the orbit increases the probability of electron transfer to an interface (as for example in a solar cell embodiment) or to an atomic or molecular reactant (as in a photon energy conversion cell which utilizes chlorophyll) increases. Importantly the exciton orbit increases with increasing dielectric constant. Therefore not only are excitons drawn by the dielectric gradient towards the high dielectric region the transfer (or reaction) probability increase as it progresses. The relationship between dielectric constant and nominal Bohr exciton orbit radius, $r_B$, is:

$$r_B = \frac{\hbar^2\varepsilon}{m^*e^2} \qquad \text{Eq. (8)}$$

where m* is the reduced mass. It is of note that the orbital radius for the exciton can be large (e.g., 42 angstroms) and increases linearly with increasing dielectric constant.

Also excitons in dyes and other molecules may or may not be classical hydrogen like states and be rather more like a bound electron—hole pair bound by Coulomb attraction but not orbiting each other in a classical orbit. In this case, the exciton migrates about a regions of the molecule with the speed of the slowest moving charge species of the pair. In both cases, the establishment of an environmental dielectric gradient and/use of a modified dye (or other photo absorbing structure) to have a dielectric gradient may be engineered to have benefit on transport and/or solar cell performance.

Because molecules are odd shaped and in many cases linear, there are many cases where the forces operating between electron and hole transverse regions outside of the molecule confines allowing the environment and the environmental dielectric constant to effect the Columbic attraction and therefore the distance between the species in the charged pair.

As the above discussion of theory shows, a dielectrically graded region utilized within an energy conversion cell alters the direction and rate of reaction generated species transport there through. By incorporating or providing one or more dielectrically graded regions within an energy conversion cell, in an embodiment of the technology, the efficiency of the species transport can be improved. Consequently, lower cost materials can be provided in the energy exchange region 13 (shown in FIG. 1) of the energy conversion cell 10, thereby making some applications (e.g., photon energy conversion) more commercially viable. In another embodiment, the dielectrically graded region incorporated in a photon-energy conversion cell can impede the transfer of excitons by incorporating a decrease in the dielectric gradient along the direction of exciton transport, thereby creating an effective block against unwanted or undesired consequences of exciton—material interactions.

By incorporating a dielectric region 14 within the energy conversion cell 10 shown in FIG. 1, lower cost materials can be used to create energy thereby making alternative energy more commercially viable. For example, the dielectric region 14 can be used in a dye-sensitized solar cell. In this embodiment, the energy exchange region 13 (a photon absorption region) can include a liquid dye, such as an Anthocyanin-based dye. Photons absorbed by the dye excite the dye material resulting in the generation of an exciton (an electron-hole pair). The dielectric region 14, located adjacent to the exchange region 13 is formed of a dielectrically graded composite. In this embodiment, the dielectric region consists of a matrix of water with a plurality of glass particles disposed within the matrix. The concentration of glass particles is monotonically varied through the dielectric region such that the dielectric constant is graded producing a gradually increasing dielectric constant in a direction extending from the dielectric region 14 towards cathode 11. The dielectric region 14 with graded dielectric constant provides a motive force which aids in the transport of the electron away from the energy exchange region 13 into the first transport region 12 (formed in this embodiment of $TiO_2$ particles) and towards the cathode 11. The hole left behind in the photon reaction would be filed from an electron from the second transport region 15 (formed in this embodiment of an electrolyte containing an iodine complex). The hole is thus transported through the second transport region 15 towards the anode 16.

The dielectric region 14 of energy conversion cell 10 can also be used in conjunction with other types of solar cells. For example the, energy exchange region may be formed from another type of photon absorption material, such as for example, a semiconducting solid or liquid. The semiconducting solid or liquid would have a band gap between about 0.5 eV to about 3 eV. Some examples of semiconducting solids include, but are not limited to, elemental materials such as silicon, germanium, alloys such as Si—Ge, polymers such as oligothiophene, phthalocyines, and pentacene-based materials and organic materials such as chlorophyll.

In addition, the dielectric region can also be used in conjunction with chemical energy conversion cells such as fuel cells. In one such embodiment, the dielectric region 14 is located within the first and second transport regions 12, 15, each of which are formed from a conductive polymer membrane and include a plurality of $TiO_2$ particles dispersed therein. The $TiO_2$ particles provide the polymer membrane with the dielectric gradient function. (That is, the TiO2 particles can be incorporated to provide the dielectric grading.) Each of the cathode 11, energy exchange region 13, and the anode 16 are formed of a catalytic surface such as platinum.

In the above fuel cell embodiment, the anode separates electrons off of a reactant fuel, such as for example, hydrogen. The electron cannot travel through the transport regions 12, 15, but instead are collected and allowed to travel through an external surface. Ions (or a proton, in hydrogen fuel cell embodiment) travel through the second transport region 15, which includes the dielectric $TiO_2$ particles. The $TiO_2$ particles are graded to provide increasing dielectric strength along the direction of transport to increase the mobility rate. The proton is transported through the second transport region 15 to the energy exchange region 13/cathode 11, where the proton encounters another catalytic surface. Here electrons, returned from the external circuit, are allowed to join with a fuel (e.g., hydrogen) and an oxidant (e.g., oxygen) to form water. Power is derived from the electrons traveling the external circuit.

In some fuel cell embodiments, the dielectric region(s) instead of or in addition to being combined with the transport regions, is/are positioned as layers or coatings on the anode and cathode to aid in electron exchange regions. In general, these dielectric coatings have a high dielectric constant (e.g., greater than 50).

Figure 2:
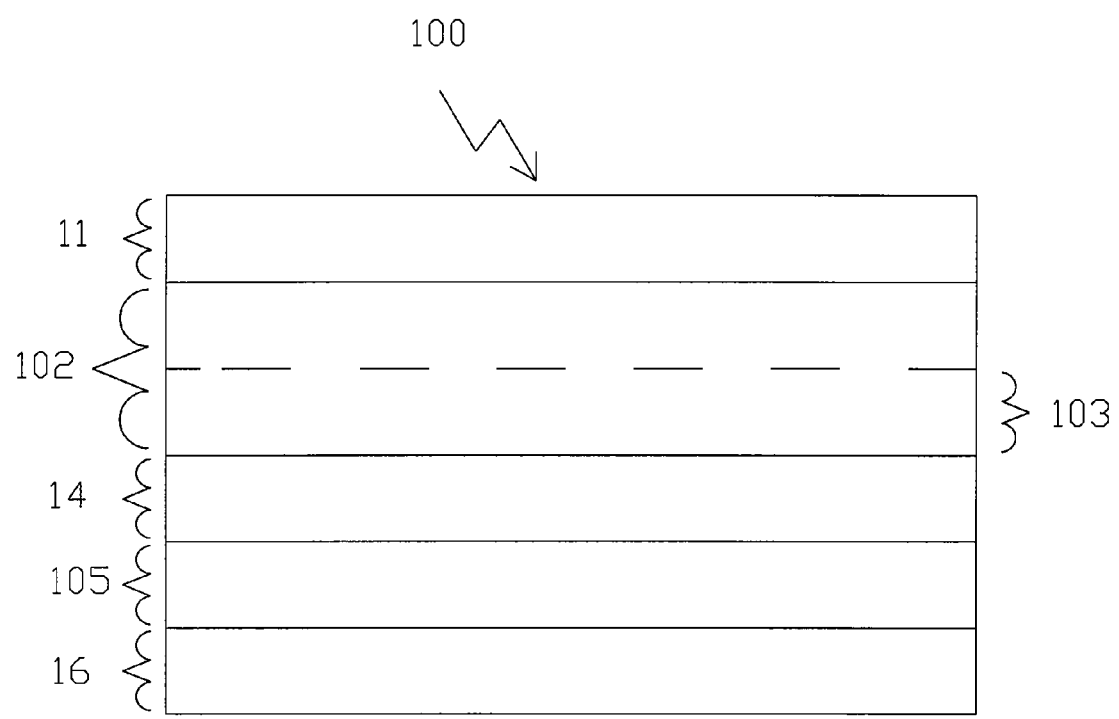
FIG. 2 is an illustration of a cross-section view an another embodiment of an energy conversion cell.

While FIG. 1 illustrates the incorporation of dielectric region 14 into an embodiment of an energy conversion cell, other embodiments are also possible. For example, the energy exchange region 13 (i.e., region where reaction is initiated in a cell, such as a photon absorbing region in a solar cell or an initial chemical reaction region in a fuel cell), does not need to be separate from the transport regions as shown in the embodiment of FIG. 1. Rather, an energy exchange region 103 can be incorporated into the first transport region 102 (i.e., dispersed throughout) or some portion thereof of an energy conversion cell 100 as shown in FIG. 2. Alternatively or additionally, the energy exchange region 103 can be incorporated into the second transport region 105 or a portion thereof.

Figure 3:
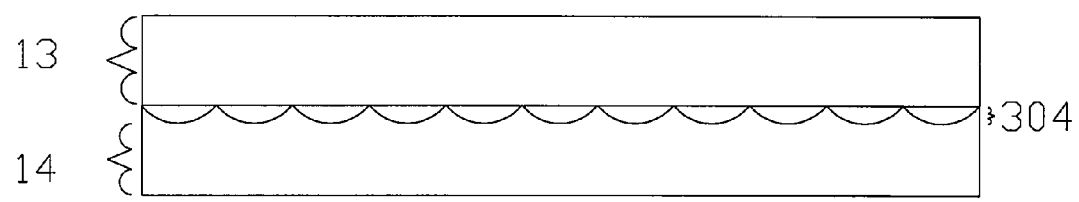
FIG. 3 is an illustration of an enlarged cross-section view of a portion of an energy conversion cell.

In some embodiments, the dielectric region 14 can be formed to include dielectric grading through the form of the region's structure. For example, as shown in FIG. 3, a dielectric region 304 is shaped during deposition to provide a structure including a plurality of bumps (shown) or ridges (not shown) along the interface between the energy exchange region 13 and the second transport region 15 within a portion of the conversion cell 10. The plurality of bumps or ridges formed of a dielectric material creates a gradient in the dielectric constant value along the direction of species transport in the dielectric region 304, by the variation in the amount of dielectric material contained through the region's width. The form of the structure can be created through the use of lithography or patterning, extrusion, or other deposition process.

Figure 4:
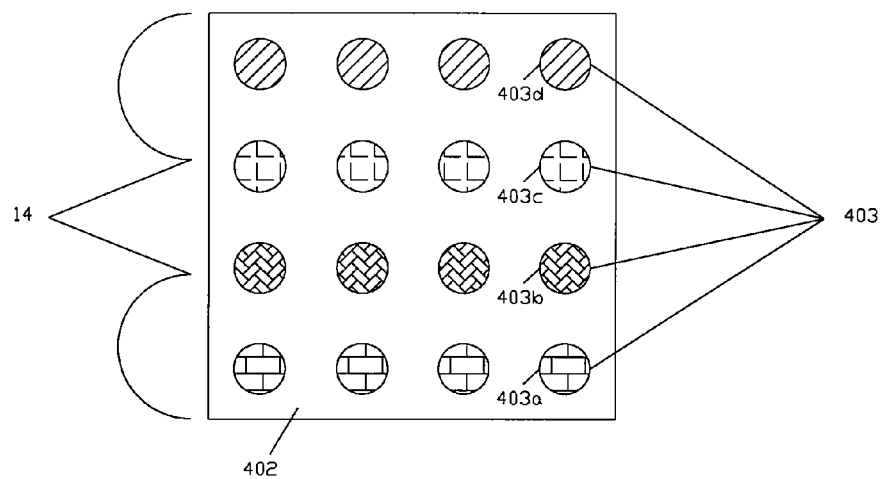
FIG. 4 is an illustration of a cross-sectional view of an embodiment of a dielectric region within the energy conversion cell of FIG. 1.

In some embodiments, the composition or make up of the dielectric region 14 is varied to create the dielectric grading. For example, FIG. 4 illustrates an embodiment of an energy conversion cell in which the dielectric region 14, includes a plurality of particles 403 in a matrix material 402. The particles 403 and the matrix material 402 have different dielectric constant values, and as a result, the dielectric constant value varies dependent on the location within the dielectric region 14. In addition, the plurality of particles 403 can include particles of different materials. For example, the composition of the particles 403 can change through the dielectric region 14. As shown in FIG. 4, a first area of the dielectric region 14 includes particles 403a formed of material having a dielectric constant of $\in_a$; a second area including particles 403b formed of a material having a dielectric constant of $\in_b$, a third area including particles 403c formed of a material having a dielectric constant of $\in_c$, and a fourth area including particles 403d formed of a material having a dielectric constant of $\in_d$. By selecting the dielectric materials of particles 403a, 403b, 403c, and 403d such that $\in_a<\in_b<\in_c<\in_d$, the dielectric region 14 can be tailored to produce a desired dielectric grading (e.g., increasing dielectric constant in the direction from the first area to the fourth area of the dielectric region 14).

Figure 5:
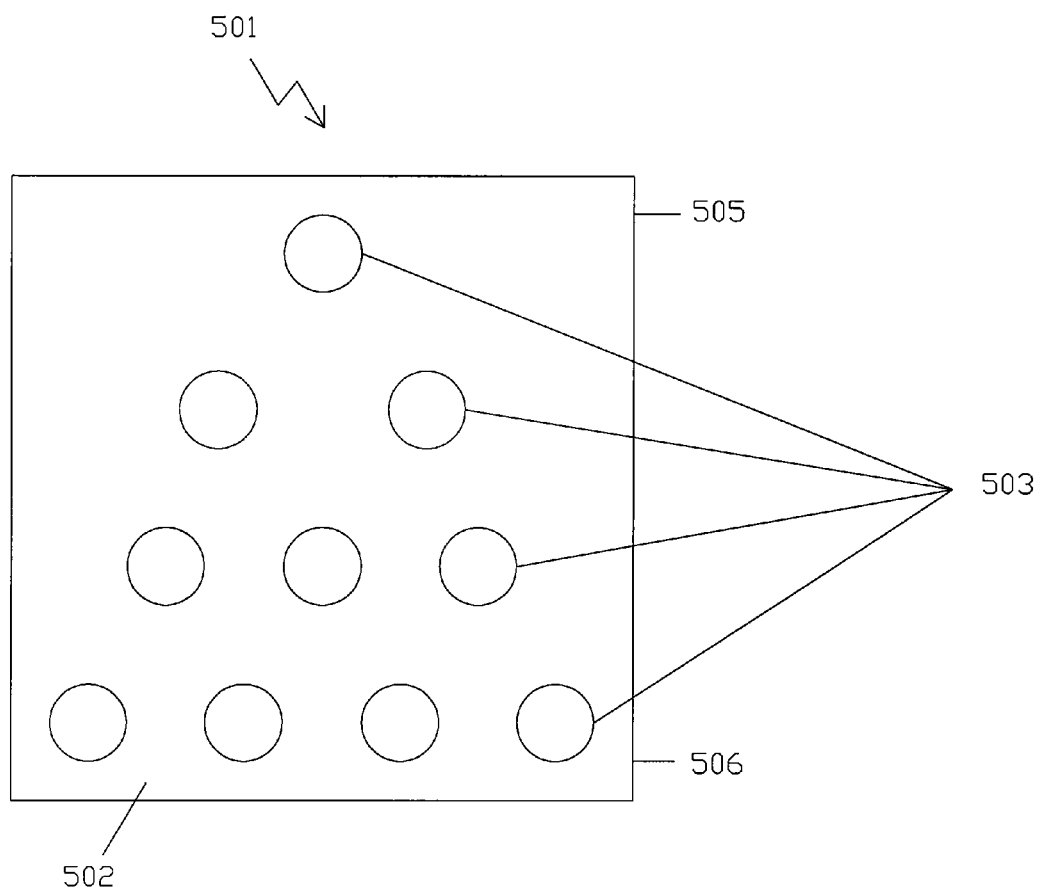
FIG. 5 is an illustration of a cross-sectional view of another embodiment of a dielectric region for use within an energy conversion cell.

The plurality of particles in the dielectric region 14 can also be monotonically varied in concentration through the dielectric region to create the dielectric gradient. For example, FIG. 5 shows an embodiment in which the concentration of the dielectric particles 503 (i.e., the number per unit volume) is varied through a matrix material 502 to provide the gradient. In this example, the dielectric constant increases from the top 505 of dielectric region 501 towards the bottom 506 of dielectric region 501.

Figure 6:
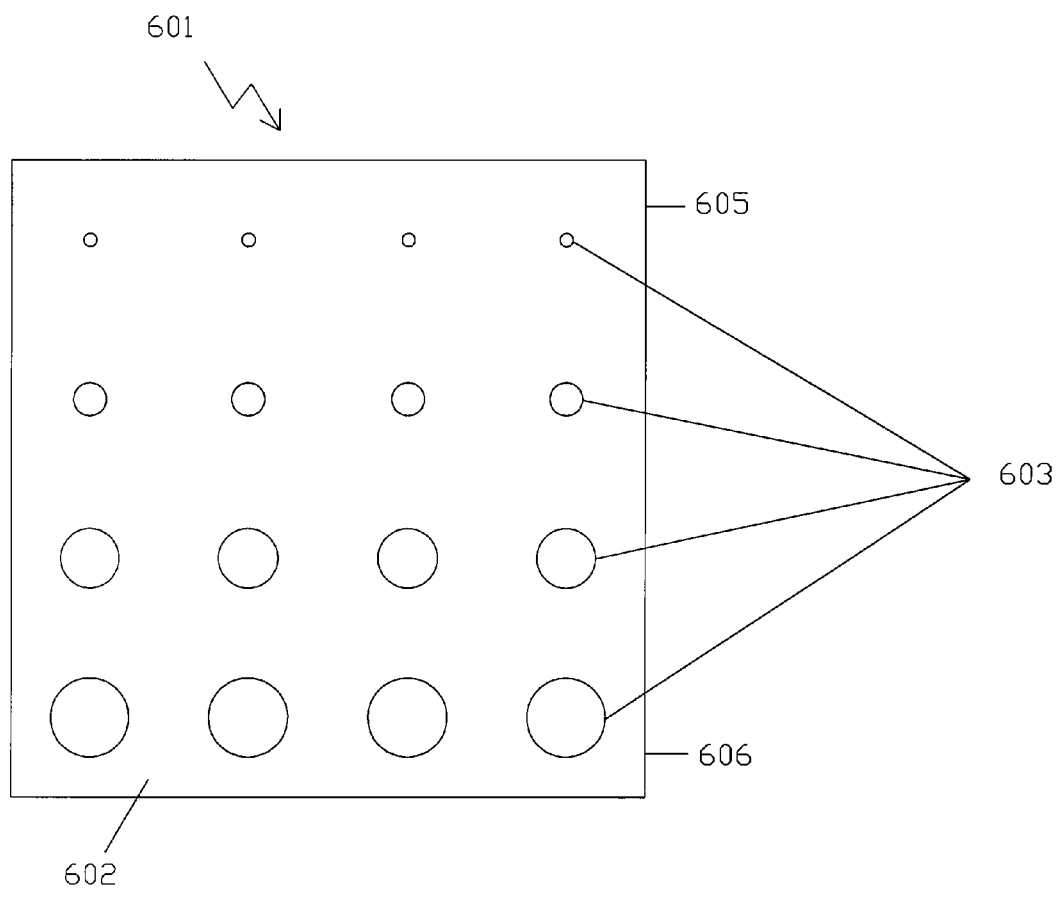
FIG. 6 is an illustration of a cross-sectional view of another embodiment of a dielectric region for use within an energy conversion cell.

In another embodiment, the size of the plurality of particles can be varied monotonically to create the dielectric gradient. For example, FIG. 6 depicts an embodiment, in which the size of the particles increases from the top 605 of the dielectric region 601 towards the bottom 606 of the dielectric region. As a result, the amount of dielectric material contained within the particles increases per unit volume from the top 605 to the bottom 606, thereby providing a gradient.

Figure 7:
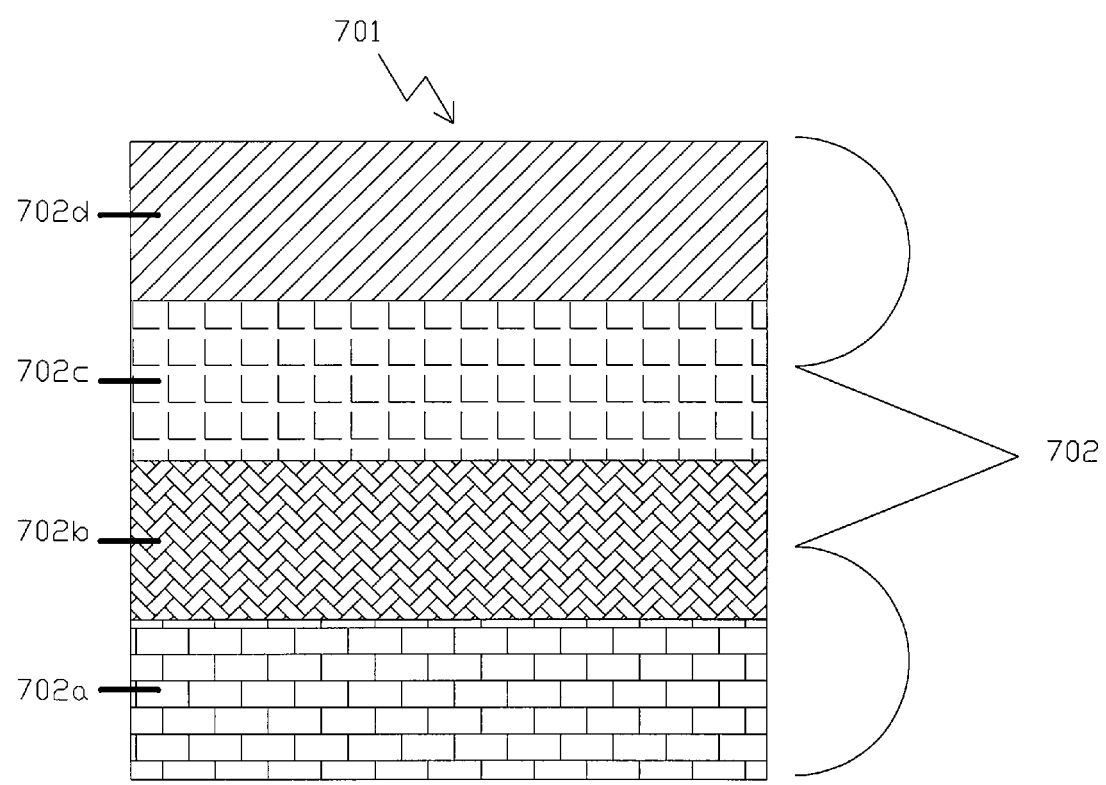
FIG. 7 is an illustration of a cross-sectional view of another embodiment of a dielectric region for use within an energy conversion cell.

The dielectric region 14 can be formed as a graded layer of material (e.g., a layer a dielectric material in which the value of the dielectric constant varies from a first location 702*a* through the dielectric region 701, locations 702*b* and 702*c* for example, to a last location 702*d*, as shown in FIG. 7); a region including a structure of shaped dielectric material to provide the gradient (e.g., plurality of bumps or ridges, shown in FIG. 3); or as a composite material in which the concentration of either the matrix material or the incorporated material (e.g., plurality of particles, shown in FIGS. 4-6) is monotonically varied. Other embodiments are also possible. Dielectric materials can be formed of any type of material (e.g., solid, liquid, gas) having a dielectric constant of at least about 1. Some examples of dielectric materials include water, air, waxes, glass, ceramics. In particular, particles of glass beads disposed within a matrix of water can be used to form the dielectric region 14.

The length scale of the dielectric gradient effects reaction generated species transport. Small length scales (e.g., less than 100 angstroms and typically in the range of about 10 to 50 angstroms) effect the transport within an individual molecule or an individual grain of material. For a dielectric gradient to have an impact on this size scale, the dielectric structure should have a similar size scale (i.e., be small enough and have a grading step small enough to cause a marked increase or decrease in the dielectric strength over about 10 to 50 angstroms).

Figure 12:
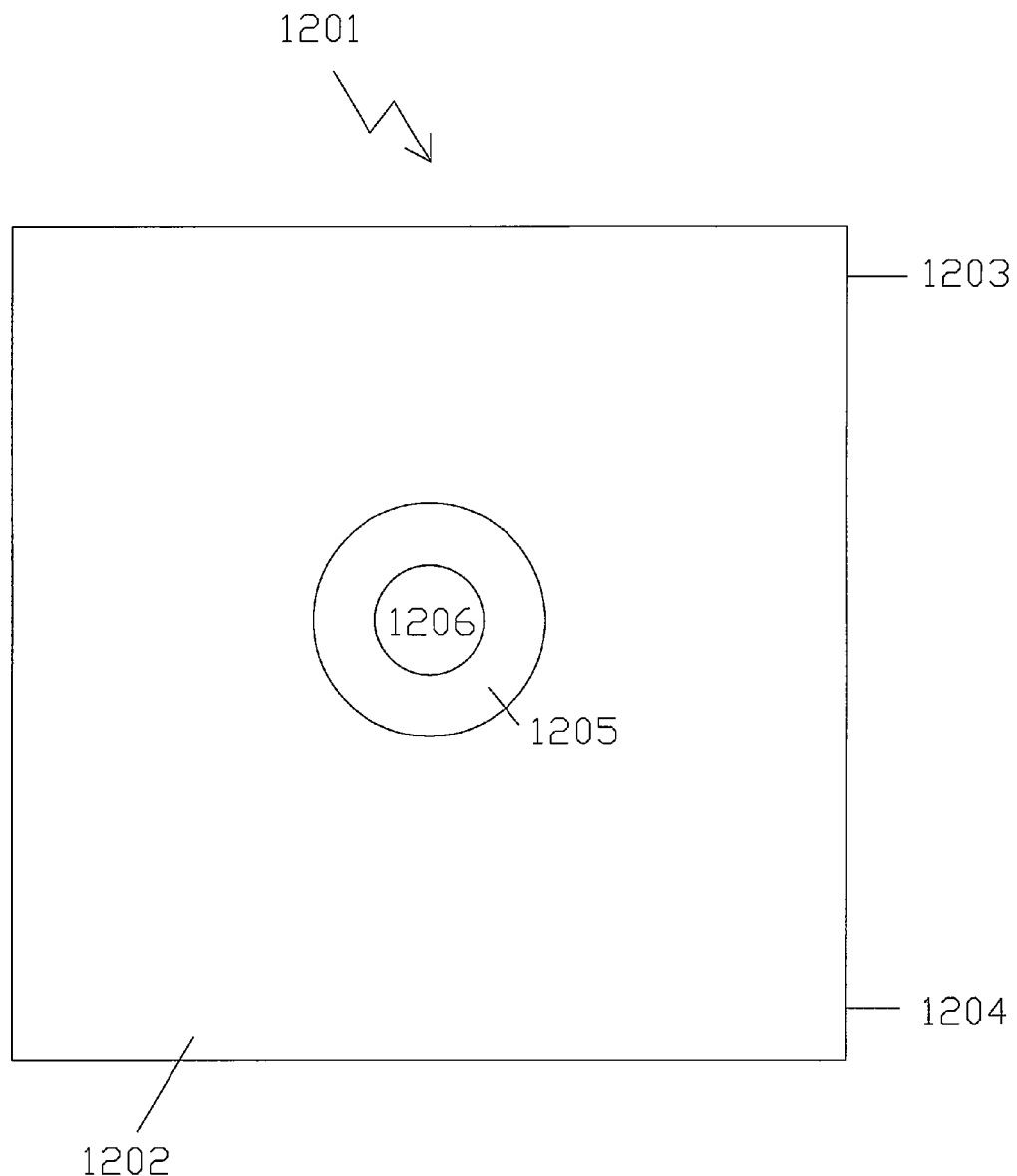
FIG. 12 is an illustration of a cross-sectional view of a reaction generated species within a graded dielectric region.

FIG. 12 illustrates that the addition of small sized structures or steps having different dielectric strength than the remainder of the environment can create a dielectric gradient of molecular scale. For example, in a dielectric region 1201 formed of a dielectric material 1202, the gradient in dielectric strength or constant between the dielectric region's bottom 1204 and top 1203 can be graded (i.e., stepped) on a length scale to impact a single reaction generated species 1206 within a molecule 1205. Specifically, if the dielectric material 1202 is graded to have a change in dielectric strength on the same or similar size scale as molecule 1205, the dielectric gradient will have a marked effect on species transport. Thus, in this case, the dielectric gradient step size or length scale is about 10 to 100 angstroms (e.g., 10 to 50 angstroms, 20 to 40 angstroms) for a molecule size of about 5 to 50 angstroms.

The above small size length scale is effective at altering species transport for a singe or limited number of reaction generated species. It is also useful for altering the transport of excitons, as it is believed that excitons dissociate upon leaving a molecule or single grain of material. However, the length scale of the dielectric grading may be increased to a large length scale to have an effect on the transport of a cluster or collection of reaction generated species. In this case, the combined size scale of the reaction generated species can be thought of as a single unit. That is, the collective motion of many species will be effect by a similar sized dielectric gradient in the surrounding environment. As a result, in order to have a marked impact on the transport of a collection or cluster of reaction generated species, the length scale of the dielectric grading is on the order of about 10 nanometers (e.g., 20 nm, 30 nm, 40 nm, 50 nm, 100 nm, 200 nm).

Depending upon application of the energy conversion cell, it may be advantageous to provide the cell with more than one dielectric region. For example, instead of including just a single dielectric region 14 within conversion cell 10 located between the energy exchange region 13 and the second transport region 15, two dielectric regions could be provided. Specifically, a first dielectric region disposed between the energy exchange region 13 and second transport region 15 could be supplemented with a second dielectric region disposed between the energy exchange region 13 and the first transport region 12. In another possible embodiment, a first dielectric region having a dielectric grading on a length scale of less than 100 angstroms together with a second dielectric region having a dielectric grading on a length scale of 10 nanometers or greater is also provided within a single energy conversion cell. Other locations and number of dielectric regions are also possible.

Figure 8:
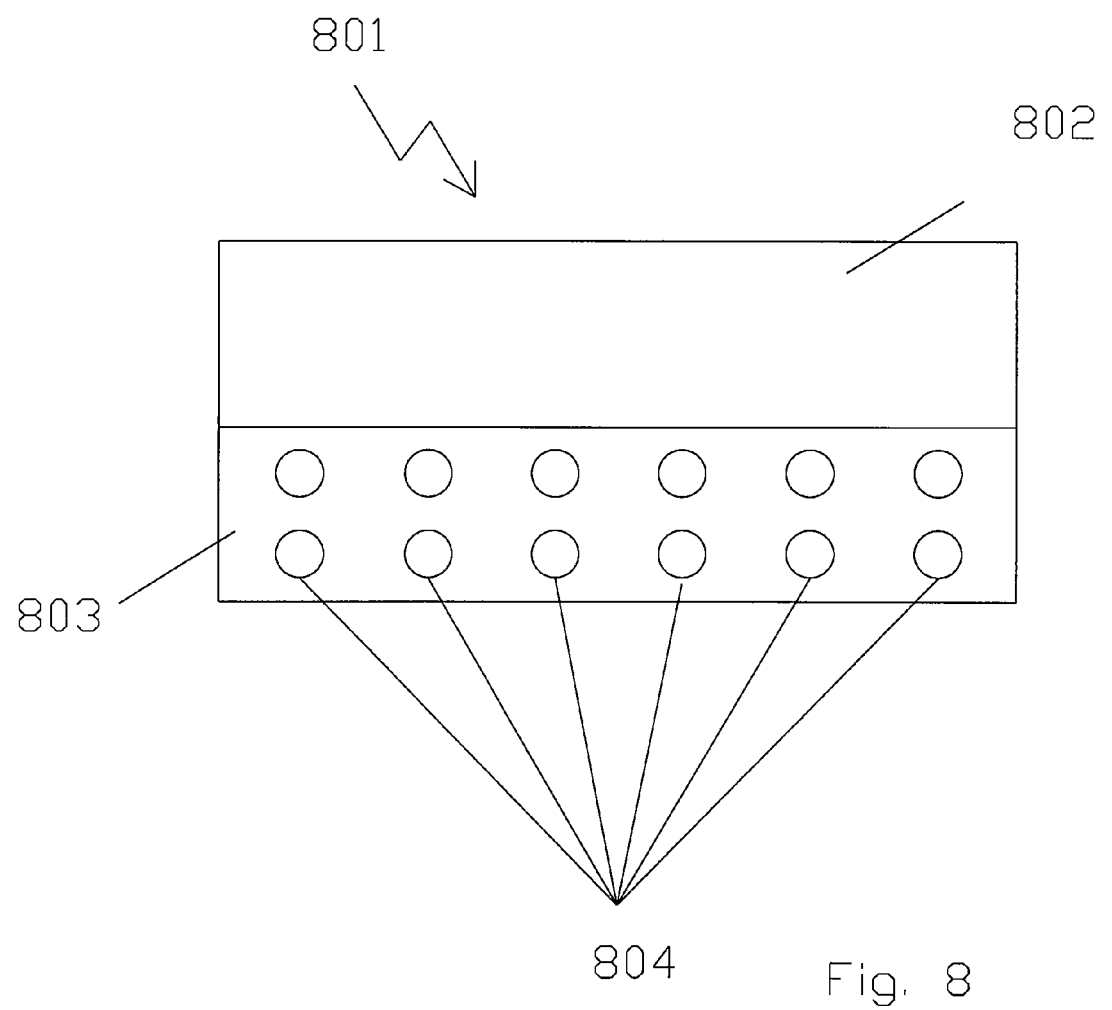
FIG. 8 is an illustration of a cross-section view of a spectral modification region for use within a photon energy conversion cell.

To further aid efficiency and transport, additional or optional elements may be included to enhance power generation. For example, for photon energy conversion cells, spectral modification regions may be incorporated into one or more regions of the cell 10. A spectral modification region is a region or area of a photon energy conversion cell in which the materials within the spectral modification region convert unused long wavelength light into useable short wavelength to significantly enhance performance and realize power. Examples of spectral modification regions are described in U.S. patent application Ser. No. 12/175,208 entitled "Solar Cell" and published as US20090050201, the entirety of these disclosures are hereby incorporated by reference herein. In one embodiment, shown in FIG. 8, a spectral modification region 801 includes a matrix or substrate material 802 and a composite film 803 disposed on the matrix material 802. The composite film 803 is formed of one or more luminescent materials (e.g., yttrium, erbium, rhenium and hafnium) and a plurality of micron-sized silicon particles 804. While any light transmitting or transparent material can be selected for the matrix material, the materials in combination must be select to provide that the matrix material 802 and the composite film 803 have different refractive indexes. The difference in refractive index between the matrix material 802 and the composite film 803 aids in the conversion of long wavelengths to shorter ones more usable by the energy exchange region 13. By converting more of the light that is incident to a photon energy conversion cell device to a wavelength that is more conducive to photon absorption by the energy exchange region 13, increased reaction species transfer can be achieved. The spectral modification region 801 can be positioned anywhere within a photovoltaic cell. In particular, in some embodiments, the spectral modification layer is positioned within a glass sheet or other protective casing outside of the cathode 11 or anode 12 shown in FIG. 1. In other embodiments, the spectral modification layer is positioned between the cathode 11 and the energy exchange region 13.

Some embodiments may also feature devices which apply an electric field to the energy conversion cell 10 to increase efficiency. In the case of charges (e.g., electrons and holes) and ions it is possible to create the situation in which both a electric field gradient (a gradient in the electric potential) and a gradient in the dielectric constant act simultaneously. Simultaneous two-field transport can be vastly faster than electric field only transport.

Unfortunately, the combination of electric potential gradient and dielectric gradient will not be applicable to exciton transport. Excitons, unlike charges and ions, are not charged and thus the electric field gradient provides no motive force on excitons.

It is believed, and explained in more detail below, that the combination of both an electric field gradient and a dielectric constant gradient provide form improved charge and ion transport within an energy conversion cell.

Figure 9:
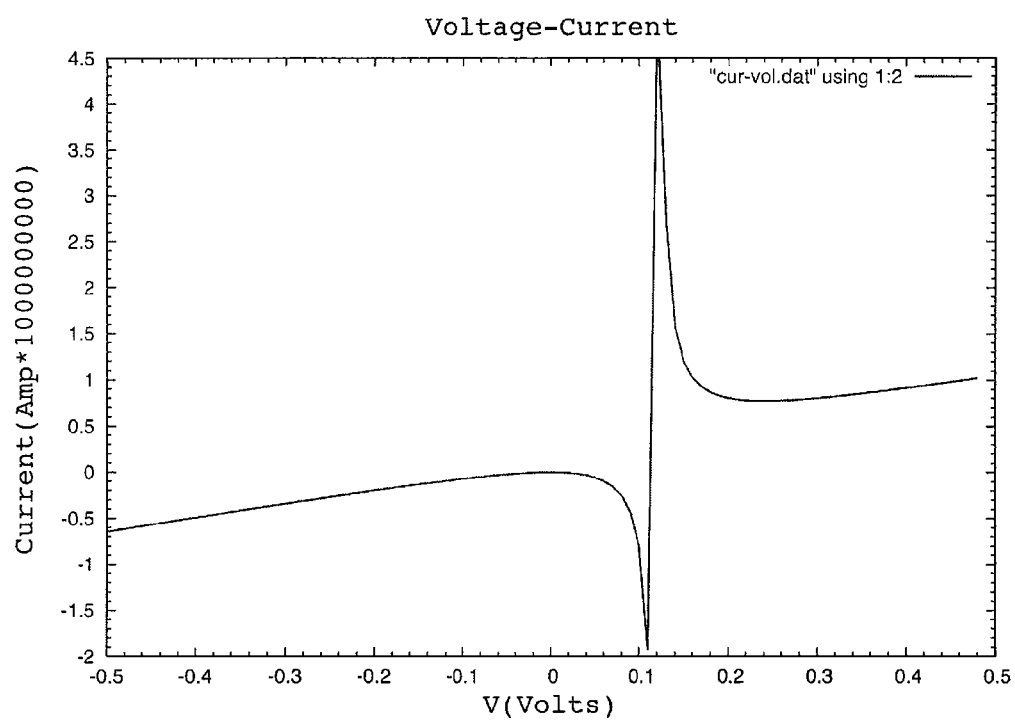
FIG. 9 is a graph of the ionic current of a neuron under the influence of both an electric field gradient and a dielectric gradient.

The mobility of a charged carrier in the presence of an electric field and a second energy type field, $\nabla\Phi$, is:

$$\mu = \frac{D\nabla \ln(n_p)}{\nabla\Phi + kT\nabla \ln n_p}. \qquad \text{Eq. (9)}$$

where, $n_p$ is the density of the ion or charge carrier under consideration. It is apparent that when the concentration gradients in the second energy type and the product of kT and the gradient in concentration, $n_p$, sum to a small value that the mobility becomes large thereby significantly increasing charge flow. A plot of the calculated current flow in a neuron is shown in FIG. 9. Note when applied voltage (or the corresponding ionic concentration gradient since the two are related by the Nerst Equation) hits a particular value, ~0.1V in this case, transport become very fast with large conductance and consequently small resistance. Little applied voltage is needed to move charge when the applied voltage (or applied concentration gradient) produces a corresponding energy gradient, $KT\nabla \ln(n_p)$, that cancels the other term in the denominator of Eq. 9, the gradient in the second energy term.

Equating the non-electric field gradient with the electrostatic energy gradient of Eq. 4 ($\nabla\Phi\equiv\nabla W$) describes how a dielectric gradient can influence the mobility charge carrier and/or ion. In turn, mobility determines the transport speed (since carrier velocity is the product of the mobility and the electric field, $\vec{v}=\mu\vec{E}$).

As a result, the speed of transport can be further optimized by utilizing an electric field device in combination with a dielectric region within an energy conversion cell device. For example, shown in FIG. 10, an electric field device 17 can be provided to supply an electric field across at least one of the first transport region 12 and the second transport region 15. The electric field device 17, may be an external device to the energy conversion cell 10 and applied thereto or alternatively, an electric field device 17 may be a structure within one or more of the regions 12, 13, 14, or 15 of the cell 10. An example of a structure which would provide an electric field is the incorporation of boron atoms into the first transporting region 12 together with the incorporation of arsenic atoms into the second transporting region 15.

Figure 10:
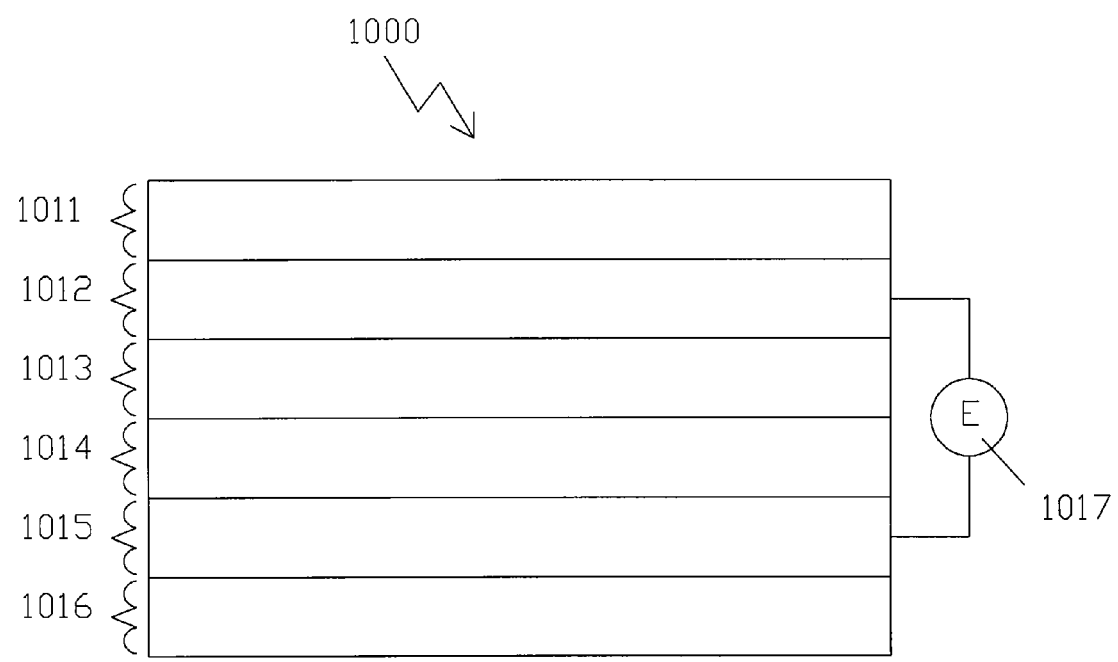
FIG. 10 is an illustration of a cross-section view of the energy conversion cell of FIG. 1 further including an electric field device.
Figure 11:
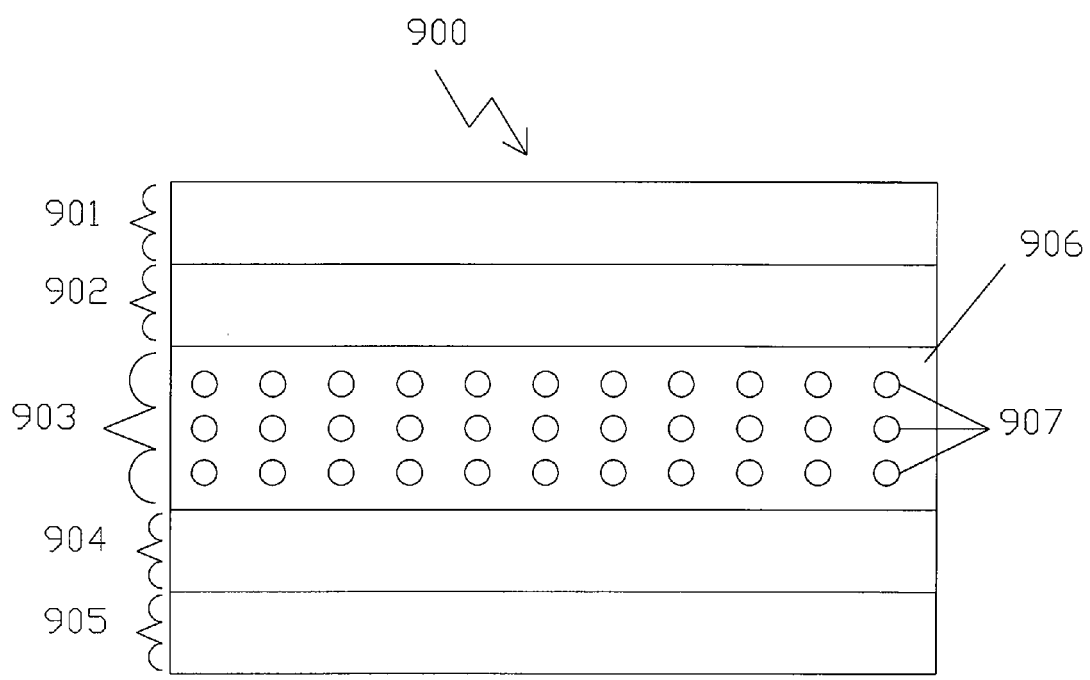
FIG. 11 is an illustration of a cross-section view of another embodiment of an energy conversion cell.

In the embodiments shown in FIGS. 1, 2, and 10, the energy conversion cell 10 includes an energy exchange region which is distinct from the dielectric region. It is possible, however, to provide a single region in which both the energy exchange function and the dielectric gradient function are combined. For example, referring to FIG. 11, an energy conversion cell 900 includes a cathode 901, a first transport region 902, an energy exchange region 903, a second transport region 904, and an anode 905. The energy exchange region 903 includes a matrix material 906 and a second material 907 dispersed within the matrix. The matrix material 906 provides the energy exchange function. That is, the matrix material 906 is a material which reacts with photons to create reaction species in a photon energy conversion device (e.g., solid single crystal semiconductor, a solid plastic semiconductor, a polymer semiconductor, an inorganic semiconductor or a liquid semiconductor) or is a material capable of initiating the desired reaction in a fuel cell (e.g., a catalytic surface). The matrix material 906 has a dielectric constant value which is different from the second material 907. As a result of incorporating the second material 907 into the matrix material 906, a dielectric gradient can be formed.

In some embodiments, the second material 907 is incorporated by including a plurality of particles of a material different from the matrix material 906. In other embodiments, the second material 907 is incorporated by including a plurality of voids (e.g., bubbles of air) within the matrix material 906. The dielectric gradient within the energy exchange region 903 can further be tailored by including particles of different dielectric materials, monotonically varying the concentration of the particles through the region, monotonically varying the size of the particles through region 903, or any combination thereof.

In some cases, inhibiting exciton transport is important for stopping unwanted energy transfer. For example, in suntan lotions it is desirable to absorb harmful UV light using zinc oxide or titanium oxide particles. These particles were once common components of suntan lotions. Upon UV photon absorption in zinc oxide or titanium oxide (as well as other materials), it is known that an exciton often forms. Upon subsequent exciton dissociation the high-energy electron (a part of the exciton) can be transferred to a biological molecule in the surrounding environment causing damage (e.g., skin damage).

The application of low dielectric constant coating on the zinc oxide or titanium oxide particle, where the dielectric constant of the coating is substantially less than the dielectric constant of the environment (i.e., tissue) and is also substantially less than that of the oxide particle (i.e., zinc oxide, titanium oxide, or other UV absorbing particle or structure) can be utilized to substantially inhibit or stop exciton (or its dissociated species) transport. The exciton and/or exciton orbit will not cross into an environment having a lower dielectric strength towards an environment that has a dielectric strength equal to or greater than the surrounding oxide particle.

Figure 13:
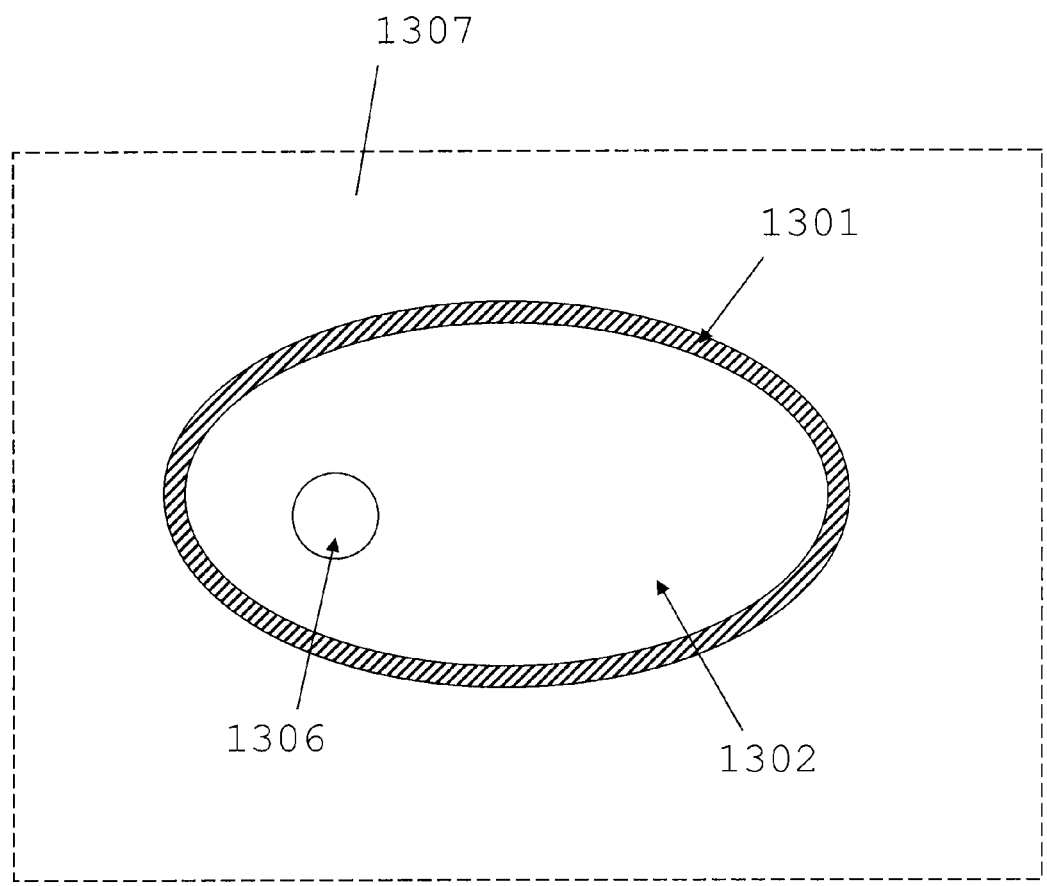
FIG. 13 is an illustration of a cross-sectional view of an embodiment of a photon energy conversion cell provided with a dielectric region which substantially inhibits exciton transport.

Referring to FIG. 13, by providing a dielectric region 1301 formed of a graded dielectric material to surround a photon absorbing particle 1302 (i.e., a photon absorption region), movement or transport of an exciton 1306 can be prevented from leaving the particle 1302 and entering the surrounding environment 1307 (i.e., tissue and protein or other biological structure therein are the corresponding first transport region and cathode). In this example, the particle 1302 serves as the photon absorption region and also as the second transport region and the anode of a photon energy conversion cell.

The application of the dielectric region 1301 having a dielectric strength less than the particle 1302 (and less than the surrounding tissue environment) and having a dielectric gradient less than about 100 angstroms (e.g., 60 angstroms, 50 angstroms, 40 angstroms) will inhibit transport. That is, the length scale of the graded dielectric material is on the order of 100 angstroms or less to inhibit the transport of the exciton or dissociated species from the particle. The dielectric region 1301 can be graded in a single step (i.e., the thickness of the dielectric region is on the order of less than 100 angstroms) or the dielectric region 1301 can be graded in a multi-step fashion (i.e., each step is less than 100 angstroms).

In one embodiment, a titanium oxide particle (having a dielectric constant of about 14 to 1400) to be used in suntan lotion is coated with a 50 angstrom thick layer of carnauba wax (having a dielectric constant of about 2 to 3). This application of carnauba wax is effective at inhibiting transport of the photon reaction generated species from exiting the titanium particle and entering an aqueous environment (having a dielectric constant of about 75), such as human tissue.

In addition to providing devices, the technology of this disclosure is directed to providing methods of improving or altering transport of reaction species through an energy conversion device. The methods include providing an electron conversion cell device with at least one dielectrically graded region. The at least one dielectrically graded region has a length scale appropriate to the transport of a desired reaction species. For example, in general, excitons tend to dissociate upon leaving a molecule. As a result, the length scale of importance is on the order of 100 angstroms or less (i.e., the size of one molecule, small grain or particle.) In embodiments where exciton transport is to be altered or improved by the inclusion of a dielectric region, the length scale of the dielectric region is about 100 angstroms or less (e.g., 100 angstroms, 75 angstroms, 50 angstroms, or 40 angstroms, 30 angstroms, 20 angstroms, 10 angstroms). The dielectric grading, in this embodiment, has a small length scale corresponding environment of expected transport so as to cause a marked increase or decrease in dielectric strength over the same size scale as exciton transport.

In another embodiment, a method is directed to improving reaction species transport of structures of larger transport distance than excitons (i.e., cluster or collection of electrons, holes or ions). In this method, the length scale can be increased in comparison to the length scale used for altering exciton transport. Due to the larger size and influence of dielectric strength on these species, these species can travel further distances and thus the length scale of the dielectric gradient can be increased. In general, a length scale of about 10 nanometers or more (e.g., 20 nanometers 30 nanometers, 40 nanometers, 50 nanometers, 60 nanometers) alters or improves the direction and rate of speed of transport of these larger sized reaction species.

The above methods can be combined and applied to create a device having two or more dielectric regions, in which a first dielectric region is designed and provided to alter exciton transport or the second dielectric region is designed and provided to alter other reaction species transport having a larger transport distance.

The above methods can be further optimized by the form or composition of the dielectric region (e.g., the dielectric region can be deposited to form a shaped structure, such as plurality of bumps or ridges; the dielectric region can be deposited to have a specific gradient created by variations in composition, concentration, and size of the incorporated dielectric material). In some methods, an electric field can be applied in addition to the provision of a dielectric region having a dielectric gradient to aid the transport of charged species.

EXAMPLE

The following example is merely intended to illustrate the practice and advantages of specific embodiments of the present disclosure; in no event is the example to be used to restrict the scope of the generic disclosure.

A control solar cell and a solar cell including a dielectric region in accordance with the present disclosure were prepared based on the structure of an Anthocyanin-based dye sensitized solar cell. (The control solar cell was a typical or generic Anthocyanin-based dye sensitized solar cell; whereas the cell in accordance with the technology further included a dielectric region.) Sunlight was applied incident upon the electrode side of the solar cell. A carbon containing counter electrode was used. The graded dielectric layer was prepared from nano-particle alumina, a material commonly used for polishing.

Testing was carried out under simulated AM1.5 solar spectrum at room temperature. Data collected from the Anthocyanin-based solar cell including the dielectric region shows that the solar cell voltage increased even though the current decreased. Here the decreased current was due to the opaque nano-particle alumina absorbing some of the available light. A comparison of data taken from the gradient solar cell to control without a gradient layer is shown in Table 1.

TABLE 1

| Dielectric Gradient Material | $V_{oc}$ open circuit voltage | $J_{sc}$ short circuit current | $V_{max}$ voltage at maximum power | $J_{max}$ current at the maximum power | $R_{shunt}$ shunt resistance | $R_{series}$ series resistance | Fill-factor |
|---|---|---|---|---|---|---|---|
| none | 0.477 V | 1.08 mA | 0.290 V | 0.77 mA | 1500 Ohms | 130-300 Ohms | 0.43 |
| alumina | 0.493 V | 0.541 mA | 0.352 V | 0.402 mA | 4700 Ohms | 320-700 Ohms | 0.53 |

The above comparison data illustrates that the dielectric region provides a significant improvement to the voltage output over conventional dye-based solar cells.

While the technology has been particularly shown and described with reference to specific embodiment, it should be understood by those skilled in the art that various changes in form and detail may be made therein without departing from the spirit and scope of the invention as defined by the following claims.

What is claimed is:

1. An energy conversion cell having improved transport of one or more of electrons, holes, ions, excitons and radical-based charge or energy, the conversion cell comprising:
    an anode;
    a first transport region;
    an energy exchange region;
    a dielectric region;
    a second transport region; and
    a cathode;
    wherein the dielectric region is tailored to provide a dielectric constant of a graded value along a direction of transport to one of the anode or cathode to improve transport of one or more of electrons, holes, ions, excitons and radical-based charge or energy.

2. The energy conversion cell according to claim 1, wherein the energy exchange region is disposed within at least a portion of the first transport region.

3. The energy conversion cell according to claim 1, wherein the dielectric region is located at an interface between the energy exchange region and the second transport region.

4. The energy conversion cell according to claim 3, wherein the dielectric region comprises a structure shaped to provide the dielectric constant of graded value along the direction of transport.

5. The energy conversion cell according to claim 4, wherein the structure comprises a plurality of bumps or ridges along the interface.

6. The energy conversion cell according to claim 1, wherein the dielectric region comprises a plurality of particles of one or more dielectric materials disposed within a matrix material.

7. The energy conversion cell according to claim 6, wherein the matrix material is water.

8. The energy conversion cell according to claim 6, wherein a concentration of the plurality of particles is varied monotonically through the dielectric region.

9. The energy conversion cell according to claim 6, wherein a size of plurality of particles is varied monotonically through the dielectric region.

10. The energy conversion cell according to claim 1, wherein the dielectric region comprises a layer having a varied composition to provide the dielectric constant of graded value.

11. The energy conversion cell according to claim 1, wherein the energy conversion cell comprises a photon energy conversion cell.

12. The energy conversion cell according to claim 11, wherein the photon energy conversion cell comprises a photovoltaic cell.

13. The energy conversion cell according to claim 12, wherein the photovoltaic cell comprises a solid or a liquid junction solar cell.

14. The energy conversion cell according to claim 11 further comprising a spectral modification region, the spectral modification region comprising a composite film having a first refractive index and a matrix having a second refractive index different from the first, wherein the composite film is disposed on the matrix and the composite film includes luminescent materials and micron-sized silicon particles.

15. The energy conversion cell according to claim 1, wherein the energy conversion cell comprises a fuel cell.

16. The energy conversion cell according to claim 1, wherein one or more of electrons, ions, excitons and radical-based charge or energy is transported through the first transport region towards the anode, wherein the transported electron, ion, exciton, or radical-based charge or energy acts as a catalyst in a reaction within the anode.

17. The energy conversion cell according to claim 1, wherein the dielectric region has a length scale in the direction of transport of about 5,000 angstroms or less.

18. The energy conversion cell according to claim 1, wherein the dielectric region has a length scale in the direction of transport of about 10 nanometers or more.

19. The energy conversion cell according to claim 1 further comprising a second dielectric region.

20. The energy conversion cell according to claim 19, wherein the second dielectric region has a length scale in the direction of transport which differs from the length scale of the dielectric region.

21. The energy conversion cell according to claim 20, wherein one or more of electrons, ions, excitons and radical-based charge or energy is transported through the first transport region towards the anode, wherein the transported electron, ion, exciton, or radical-based charge or energy acts as a catalyst in a reaction within the anode.

22. The energy conversion cell according to claim 1 further comprising a device to apply an electric field across at least one of the first transport region and the second transport region.

23. An energy conversion cell having improved transport of one or more of electrons, holes, ions, excitons and radical-based charge or energy, the conversion cell comprising:
an anode;
a first transport region;
an energy exchange region comprising a matrix material having a first dielectric constant and a second material having a second dielectric constant which is less than the first dielectric constant, the second material being dispersed within the matrix material to form a dielectrically graded composite region;
a second transport region; and
a cathode.

24. The energy conversion cell according to claim 23, wherein the energy exchange region is disposed within at least a portion of the first transport region.

25. The photon energy conversion cell according to claim 23, wherein the second material comprises a plurality of particles or voids.

26. The photon energy conversion cell according to claim 25, wherein the matrix material comprises a plastic semiconductor, a polymer semiconductor or an inorganic semiconductor.

27. The energy conversion cell according to claim 25, wherein a concentration of the plurality of particles or voids is varied monotonically through the matrix material.

28. The energy conversion cell according to claim 25, wherein a size of plurality of particles or voids is varied monotonically through the matrix material.

29. The energy conversion cell according to claim 23, wherein the energy conversion cell comprises a photon energy conversion cell.

30. The energy conversion cell according to claim 29, wherein the photon energy conversion cell comprises a photovoltaic cell.

31. The energy conversion cell according to claim 29 further comprising a spectral modification region, the spectral modification region comprising a composite film having a first refractive index and a spectral modification matrix having a second refractive index different from the first, wherein the composite film is disposed on the spectral modification matrix and the composite film includes luminescent materials and micron-sized silicon particles.

32. The energy conversion cell according to claim 23, wherein the energy conversion cell comprises a fuel cell.

33. The energy conversion cell according to claim 23, wherein the dielectrically graded composite region has a length scale in the direction of transport of about 5,000 angstroms or less.

34. The energy conversion cell according to claim 23, wherein the dielectrically graded composite region has a length scale in the direction of transport of about 10 nanometers or more.

35. The energy conversion cell according to claim 23 further comprising a second dielectrically graded composite region.

36. The energy conversion cell according to claim 23 further comprising a device to apply an electric field across at least one of the first transport region and the second transport region.

37. A photon energy conversion cell providing substantially inhibited transport of excitons, the conversion cell comprising:
- an anode;
- a first transport region;
- a photon absorption region;
- a dielectric region;
- a second transport region; and
- a cathode;
- wherein the dielectric region is tailored to provide a dielectric constant of a graded value along a direction of transport to one of the anode or cathode to inhibit exciton transport.

38. A photon energy conversion cell providing substantially inhibited transport of excitons, the conversion cell comprising:
- an anode;
- a first transport region;
- a photon absorption region comprising a matrix material having a first dielectric constant and a material having a second dielectric constant which is less than the first dielectric constant, the second material being dispersed within the matrix material to form a dielectrically graded composite region;
- a second transport region; and
- a cathode.

* * * * *